United States Patent
Wang

(10) Patent No.: US 11,868,541 B2
(45) Date of Patent: *Jan. 9, 2024

(54) OPTICAL DETECTION DEVICE AND OPTICAL NAVIGATION APPARATUS

(71) Applicant: PixArt Imaging Inc., Hsin-Chu (TW)

(72) Inventor: Wei-Chung Wang, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 8 days.

This patent is subject to a terminal disclaimer.

(21) Appl. No.: 17/719,334

(22) Filed: Apr. 12, 2022

(65) Prior Publication Data

US 2022/0236811 A1 Jul. 28, 2022

Related U.S. Application Data

(63) Continuation-in-part of application No. 16/867,547, filed on May 5, 2020, now Pat. No. 11,353,993.

(51) Int. Cl.
| | |
|---|---|
| *G06F 3/02* | (2006.01) |
| *G06F 3/03* | (2006.01) |
| *H03K 17/94* | (2006.01) |
| *H03K 17/96* | (2006.01) |
| *G06F 3/042* | (2006.01) |
| *G06F 3/0354* | (2013.01) |

(52) U.S. Cl.
CPC .......... *G06F 3/0202* (2013.01); *G06F 3/0304* (2013.01)

(58) Field of Classification Search
USPC ........................................................ 345/175
See application file for complete search history.

(56) References Cited

U.S. PATENT DOCUMENTS

| | | | | | |
|---|---|---|---|---|---|
| 5,092,459 | A | * | 3/1992 | Uljanic | H01H 9/0242 235/145 R |
| 5,388,692 | A | * | 2/1995 | Withrow | F21V 33/0052 362/85 |
| 6,634,494 | B1 | * | 10/2003 | Derr | G01D 11/24 206/320 |
| 8,672,127 | B1 | * | 3/2014 | Clover | H04N 21/42204 206/320 |
| 10,475,937 | B1 | * | 11/2019 | Jones | H01L 31/173 |
| 10,945,664 | B1 | * | 3/2021 | Webb | A61B 5/0059 |
| 11,353,993 | B2 | * | 6/2022 | Wang | G06F 3/0317 |

(Continued)

*Primary Examiner* — Chineyere D Wills-Burns
(74) *Attorney, Agent, or Firm* — Winston Hsu

(57) ABSTRACT

An optical detection device includes a substrate, a housing, an optical modulating component, an optical sensor and a cover. The housing is disposed on the substrate and includes a first aperture. The housing is unvaried due to inspection standard or design requirement of the optical detection device. The optical modulating component is disposed on the housing and aligning with the first aperture. The optical sensor is disposed on the substrate and adapted to receive an optical signal passing through the optical modulating component and the first aperture. The cover is disposed on the housing to cover the first aperture. The cover is replaceable for attaching the cover varied for the inspection standard or the design requirement to the unvaried housing in response to a surface of the cover opposite to the housing matched and engaged with a light penetrating area on the optical navigation apparatus.

20 Claims, 7 Drawing Sheets

(56) References Cited

U.S. PATENT DOCUMENTS

| | | | |
|---|---|---|---|
| 2014/0097327 A1* | 4/2014 | Hung | G06F 3/0425 |
| | | | 250/578.1 |
| 2014/0131560 A1* | 5/2014 | Chen | G01S 17/04 |
| | | | 250/221 |
| 2017/0119120 A1* | 5/2017 | Richardson | H05K 5/0086 |
| 2017/0205879 A1* | 7/2017 | Joseph | G06F 3/03544 |
| 2021/0074874 A1* | 3/2021 | Nijaguna | H01L 33/52 |

* cited by examiner

OPTICAL DETECTION DEVICE AND OPTICAL NAVIGATION APPARATUS

CROSS REFERENCE TO RELATED APPLICATIONS

This application is a continuation-in-part of U.S. application Ser. No. 16/867,547, filed on May 5, 2020. The content of the application is incorporated herein by reference.

BACKGROUND OF THE INVENTION

1. Field of the Invention

The present invention relates to an optical detection device and an optical navigation apparatus, and more particularly, to an optical detection device and an optical navigation apparatus suitable for a variety of appearance demands in order to simplify product qualification procedure.

2. Description of the Prior Art

A conventional optical detection device includes a base and a housing assembled with each other to provide two chambers inside. An optical emitter is disposed inside one chamber, and an optical sensor is disposed inside another chamber. Then, a covering component covers the housing and is attached to all lateral surfaces of the housing and the base, and some optical components, such as lenses, are disposed between the housing and the covering component. The conventional optical detection device has to be installed on a flexible printed circuit of an optical navigation system, and an upper part of the covering component is exposed out of a hole of the optical navigation system for detecting an object. A chip package consisted of the base, the housing, the optical emitter and the optical sensor (excluding the covering component) cannot be suitable for a variety of appearance demands of the optical navigation system. The chip package and the related covering component both have to be redesigned if the hole shape of the optical navigation system is changed, such as the hole being changed from the square shape to the round shape, and therefore product qualification procedure of the conventional optical detection device is implemented after the chip package and the related covering component are redesigned and assembled.

SUMMARY OF THE INVENTION

The present invention provides an optical detection device and an optical navigation apparatus suitable for a variety of appearance demands in order to simplify product qualification procedure for solving above drawbacks.

According to the claimed invention, an optical detection device applied to an optical navigation apparatus and suitable for a variety of appearance can include a substrate, a housing, an optical modulating component, an optical sensor and a cover. The housing is disposed on the substrate and includes a first aperture. The housing is unvaried due to inspection standard or design requirement of the optical detection device. The optical modulating component is disposed on the housing and aligning with the first aperture. The optical sensor is disposed on the substrate and adapted to receive an optical signal passing through the optical modulating component and the first aperture. The cover is disposed on the housing to cover the first aperture. The cover is replaceable for attaching the cover varied for the inspection standard or the design requirement to the unvaried housing in response to a surface of the cover opposite to the housing matched and engaged with a light penetrating area on the optical navigation apparatus.

According to the claimed invention, an optical detection device applied to an optical navigation apparatus and suitable for a variety of appearance can include a substrate, a housing, an optical modulating component, an optical sensor and a cover. The housing is disposed on the substrate and includes a first aperture and an engaging portion. The engaging portion is adapted to engage with the optical navigation apparatus. The housing is unvaried due to inspection standard or design requirement of the optical detection device. The optical modulating component is disposed on the housing and aligning with the first aperture. The optical sensor is disposed on the substrate and adapted to receive an optical signal passing through the optical modulating component and the first aperture. The cover is attached to the housing except the engaging portion for covering the first aperture. The cover is replaceable for attaching the cover varied for the inspection standard or the design requirement to the unvaried housing in response to a surface of the cover opposite to the housing matched and engaged with a light penetrating area on the optical navigation apparatus.

According to the claimed invention, an optical navigation apparatus includes a case, a circuit board and an optical detection device. The case has an accommodating structure. The circuit board is disposed inside the case. The optical detection device includes a substrate, an optical sensor and a housing. The substrate is disposed on the circuit board. The optical sensor is disposed on the substrate and adapted to receive an optical signal entering the case. The housing is disposed on the substrate and covering the optical sensor. The housing includes a first aperture where through the optical signal passes. The accommodating structure is varied for inspection standard or design requirement of the optical detection device. The housing is unvaried due to the inspection standard or the design requirement, and the housing is attached to the accommodating structure in a replaceable manner for aligning with a light penetrating area on the optical navigation apparatus.

The cover or the accommodating structure directly abutting against the housing can minimize a vertical dimension of the optical detection device, and the cover or the accommodating structure disposed on the upper surface of the housing can reduce a horizontal dimension of the optical detection device. The package assembly including the substrate, the housing, the optical sensor, the optical emitter and the operation processor (but excluding the cover or the accommodating structure) can be assembled and examined by the product qualification procedure, and the cover and the accommodating structure can be an independent element not examined by the product qualification procedure. The package assembly can be assembled with the cover or the accommodating structure having any exterior contour manufactured for the appearance demand of the optical navigation apparatus. That is to say, the cover (or the accommodating structure) provided by the optical navigation apparatus and the package assembly as two separated components. The contour of one surface of the cover or the accommodating structure is designed according to the hole on the optical navigation apparatus. The exterior of the package assembly is unchanged no matter what the cover (or the accommodating structure) seems like. As if the product qualification procedure of the package assembly is implemented, the cover and the accommodating structure with the particularly redesigned contour can be attached to the package assembly and does not need extra product qualification procedure for the second time; thus, the present invention can economize qualification cost and qualification time of the optical detection device and the optical navigation apparatus effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
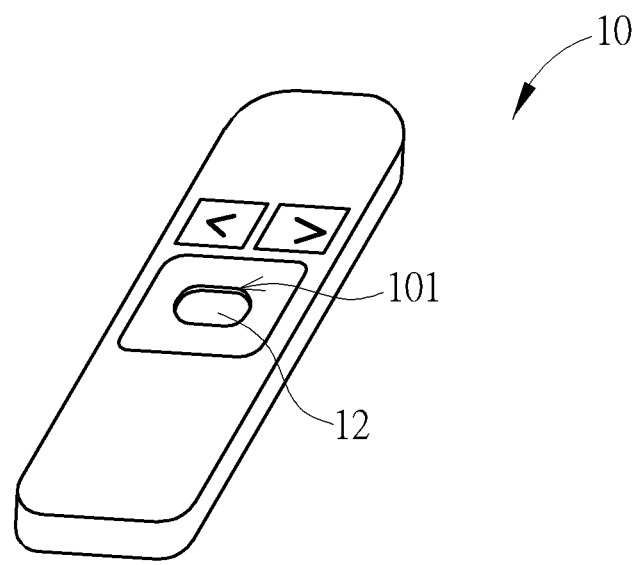
FIG. 1 is a diagram of an optical navigation apparatus having an optical detection device according to an embodiment of the present invention.
Figure 2:
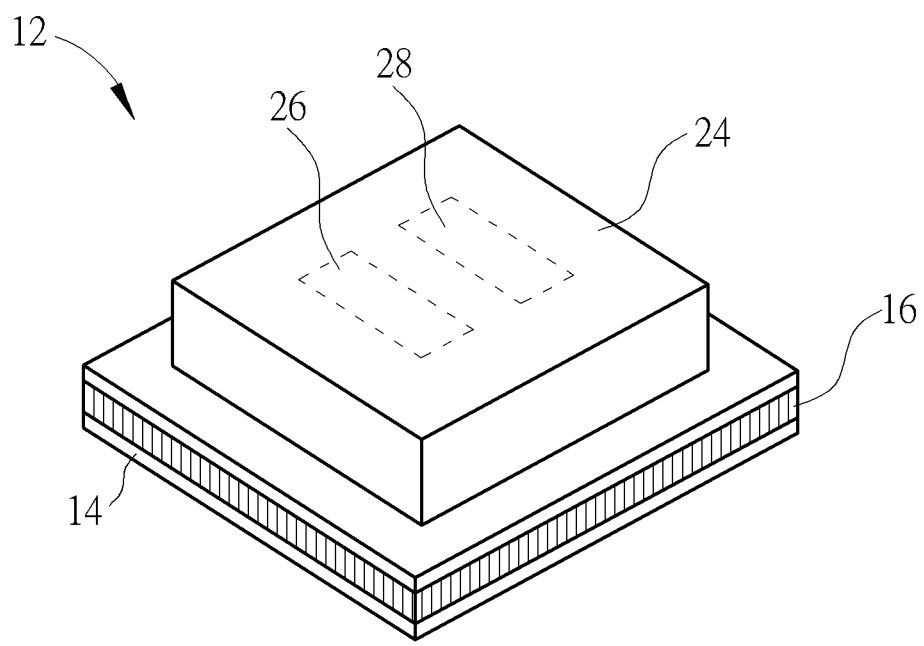
FIG. 2 is a diagram of the optical detection device according to a first embodiment of the present invention.
Figure 3:
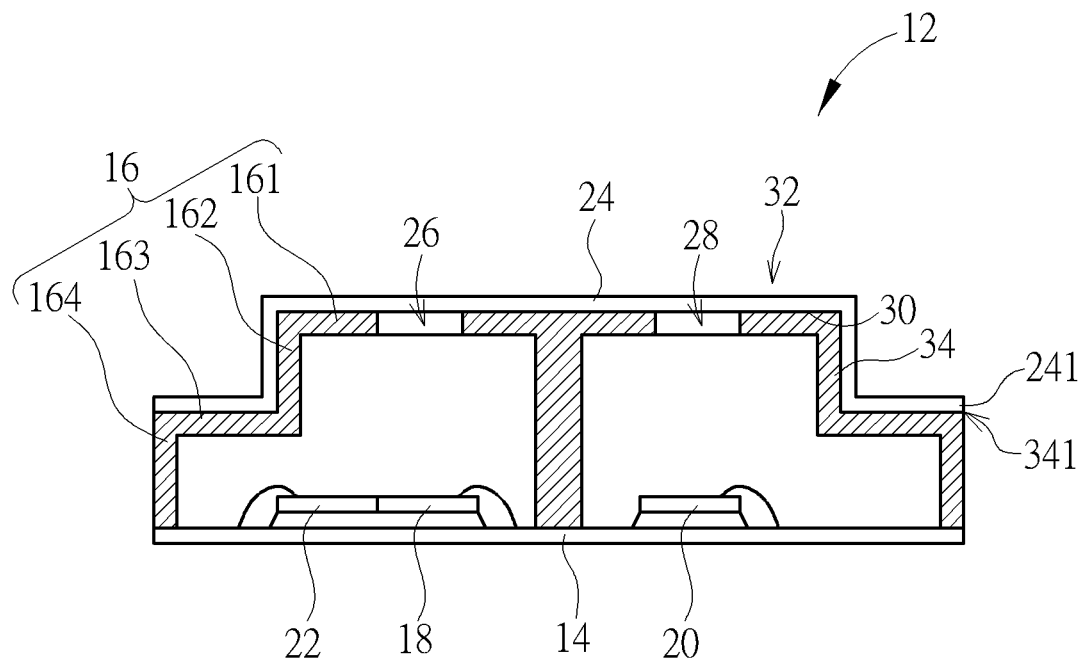
FIG. 3 is a sectional view of the optical detection device according to the first embodiment of the present invention.

Please refer to FIG. 1 to FIG. 3. FIG. 1 is a diagram of an optical navigation apparatus 10 having an optical detection device 12 according to an embodiment of the present invention. FIG. 2 is a diagram of the optical detection device 12 according to a first embodiment of the present invention. FIG. 3 is a sectional view of the optical detection device 12 according to the first embodiment of the present invention. The user can touch the optical navigation apparatus 10 to input a control command; for example, the optical navigation apparatus 10 may be an optical finger navigation apparatus used to detect a movement of the user's finger. The optical navigation apparatus 10 can be the remote control, the in-vehicle infotainment system, the steering wheel, the notebook computer, and the medical equipment. Exterior of the optical detection device 12 can be designed to match with a variety of predefined appearance demands of the optical navigation apparatus 10 for simplifying product qualification procedure.

The optical detection device 12 can include a substrate 14, a housing 16, an optical sensor 18, an optical emitter 20, an operation processor 22 and a cover 24. The housing 16 can be disposed on the substrate 14 and have a first aperture 26 and a second aperture 28. The optical sensor 18, the optical emitter 20 and the operation processor 22 can be disposed on the substrate 14 and electrically connected with each other.

The optical emitter 20 can be an optional unit adapted to emit an optical signal toward the second aperture 28. The optical emitter 20 can receive the optional unit reflected from a target object through the first aperture 26. The operation processor 22 can actuate the optical emitter 20 to adjust a frequency and intensity of the optical signal, and further receive a sensor datum from the optical sensor 18 for analysis. The cover 24 can be disposed on the housing 16 to cover the first aperture 26 and the second aperture 28.

The cover 24 can have a first surface 30 and a second surface 32 opposite to each other. The first surface 30 can be attached to the housing 16 and designed to provide a contour matched with a shape of the housing 16. Conjunction between the housing 16 and the cover 24 is not affected by a contour of the second surface 32, so that the contour of the second surface 32 can be manufactured according to the predefined appearance of the optical navigation apparatus 10. For example, the second surface 32 of the cover 24 can be a square form or a circular form. The form of the second surface 32 depends on the hole 101 on the optical navigation apparatus 10. A top portion of the optical detection device 12 can be embedded in the hole 101 for providing a touching region.

In the first embodiment, the optical sensor 18, the optical emitter 20 and the operation processor 22 can be assembled with the substrate 14 and the housing 16 to be one package assembly; the package assembly and the cover 24 can be two separated components for delivery and storage. The package assembly can be disposed on the optical navigation apparatus 10 when the product qualification procedure of the package assembly is finished. After that, the cover 24 can be assembled with the package assembly without another product qualification procedure, which means the optical detection device 12 is in no need of extra product qualification procedure in response to assembly of the cover 24 and the housing 16. Thus, if the optical navigation apparatus 10 has two holes 101 respectively having the square form and the circular form, two package assembles with identical structure need once product qualification procedure, and covers 24 with different forms can be assembled with the two package assembles without the extra product qualification procedure; the second surface 32 of the cover 24 can be manufactured as any contours according to a purpose of the touching region of the optical detection device 12.

Besides, the housing 16 may optionally include an engaging portion 34 formed on an edge around the touching region of the optical detection device 12 and adapted to engage with the optical navigation apparatus 10; part of the cover 24 may be located between the engaging portion 34 and the optical navigation apparatus 10. An upper portion 161 of the housing 16 can be set under a part of the cover 24 used as the touching region, and have dimensions the same as or similar to the touching region and the hole 101 on the optical navigation apparatus 10. The engaging portion 34 may be interpreted as a combination of a high-level lateral portion 162 and a flat portion 163 of the housing 16, which can be connected with and adjacent to the upper portion 161, and be sheltered by some part of the cover 24. The engaging portion 34 can abut against an inner wall of the hole 101 to securely fix the optical detection device 12 into the optical navigation apparatus 10.

The first surface 30 of the cover 24 has the contour matched with the shape of the housing 16, so that the first surface 30 can be tightly attached to the upper portion 161 and the engaging portion 34; an edge 241 of the cover 24 can optionally align with a lateral side 341 of the engaging portion 34, and therefore the cover 24 is not attached to a low-level lateral portion 164 of the housing 16. A protruding part of the cover 24, which abuts against the upper portion 161 and the high-level lateral portion 162, can be the touching region of the optical detection device 12 exposed out of the optical navigation apparatus 10. A shape of the protruding part is predesigned to match up the hole 101 on the optical navigation apparatus 10, and the cover 24 can be attached to the housing 16 when the optical detection device 12 passes the product qualification procedure.

Figure 4:
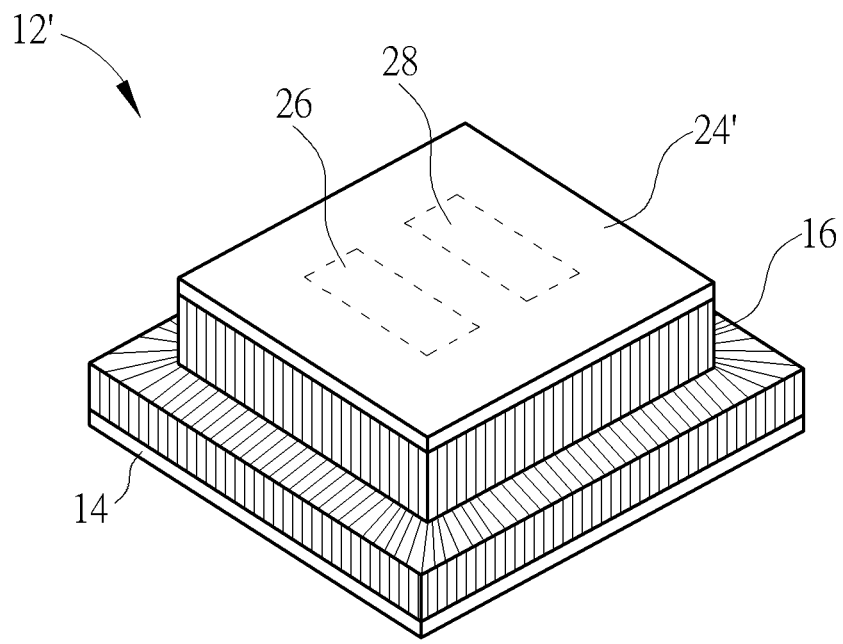
FIG. 4 is a diagram of the optical detection device according to a second embodiment of the present invention.
Figure 5:
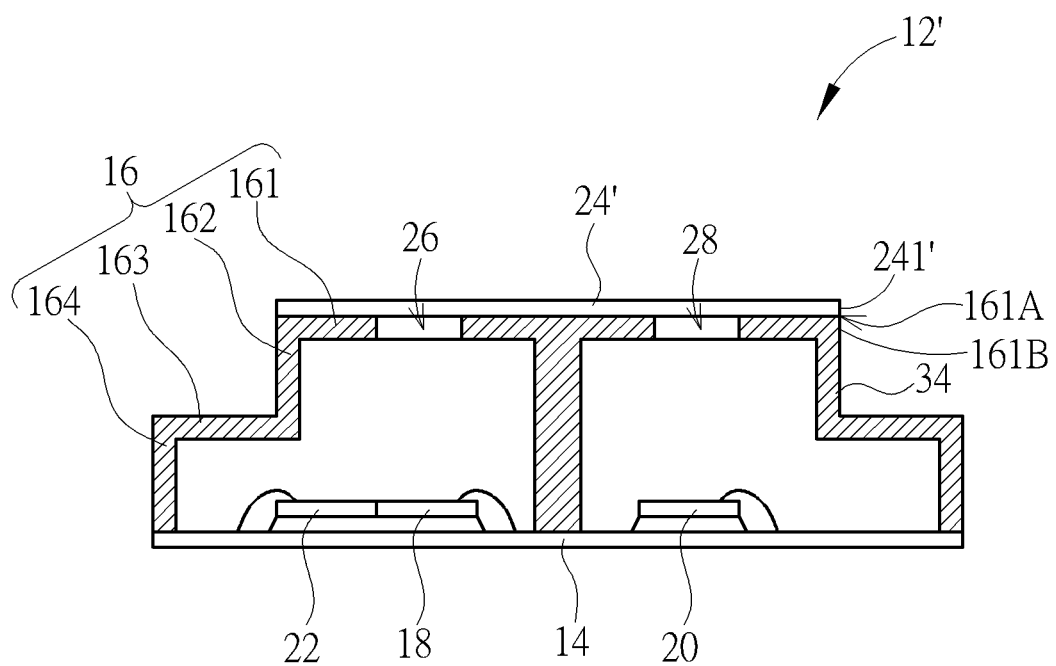
FIG. 5 is a sectional view of the optical detection device according to the second embodiment of the present invention.

Please refer to FIG. 1, FIG. 4 and FIG. 5. FIG. 4 is a diagram of the optical detection device 12' according to a second embodiment of the present invention. FIG. 5 is a sectional view of the optical detection device 12' according to the second embodiment of the present invention. In the second embodiment, elements having the same numeral as ones of the first embodiment have the same structure and function, and a detailed description is omitted herein for simplicity. The optical detection device 12' can include the substrate 14, the housing 16, the optical sensor 18, the optical emitter 20, the operation processor 22 and the cover 24'. The cover 24' covers the upper portion 161 of the housing 16, but does not cover the high-level lateral portion 162, the flat portion 163 and the low-level lateral portion 164. The product qualification procedure of the optical detection device 12' can be implemented after the cover 24' is attached to the housing 16.

In the second embodiment, the cover 24' can be designed to provide the contour manufactured for the predefined appearance demands of the optical navigation apparatus 10. The cover 24' can be attached to the housing 16 except the engaging portion 34, which means the edge 241' of the cover 24' can align with a lateral side 161A of the upper portion 161 and the cover 24' does not contact a lateral surface 161B of the upper portion 161. The optical detection device 12 of the first embodiment and the optical detection device 12' of the second embodiment can be directly installed into the optical navigation apparatus 10, rather than being disposed on a flexible printed circuit of the optical navigation apparatus 10.

Figure 6:
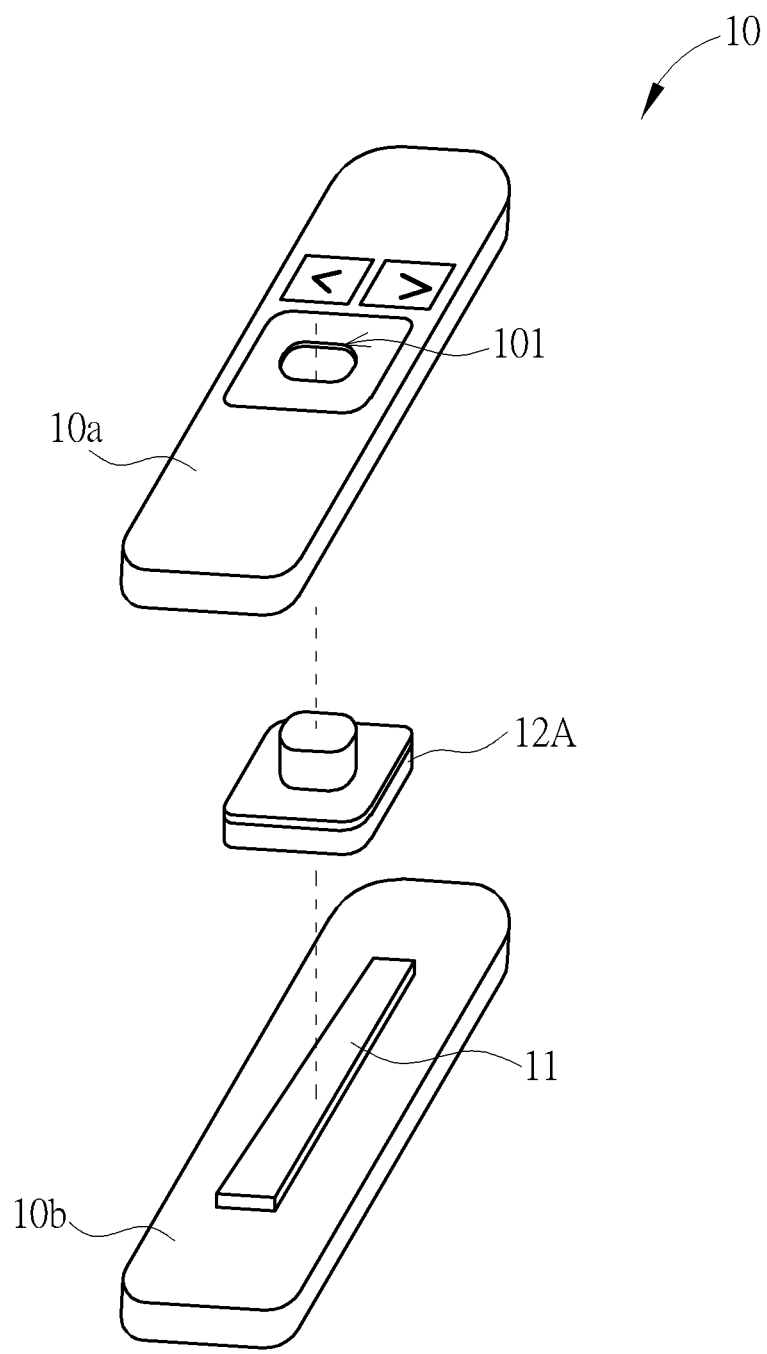
FIG. 6 is an exploded diagram of a part of the optical navigation apparatus having the optical detection device according to the embodiment of the present invention.

Please refer to FIG. 6. FIG. 6 is an exploded diagram of a part of the optical navigation apparatus 10 having the optical detection device 12 according to the embodiment of the present invention. The optical navigation apparatus 10 can include a first case 10a and a second case 10b assembled with each other, which are used to cover and protect electronic units (such as the optical detection device 12) inside the optical navigation apparatus 10. The first case 10a can have a light penetrating area capable of being manufactured as any shape for the predefined appearance demands. The second case 10b can have a circuit board 11, and the optical detection device 12 can be installed on the circuit board 11. The light penetrating area may be the hole 101, or be a specific unit manufactured by transparent material or translucent material, which depends on the design demand. The hole 101 may be an elliptic shape, and the housing 16 of the optical detection device 12 may be a square type. The present invention can dispose the cover 24 with the first surface 30 and the second surface 32 respectively having different contours on the housing 16, and the optical detection device 12 can be tightly engaged with the hole 101 without additional product qualification procedure.

Figure 7:
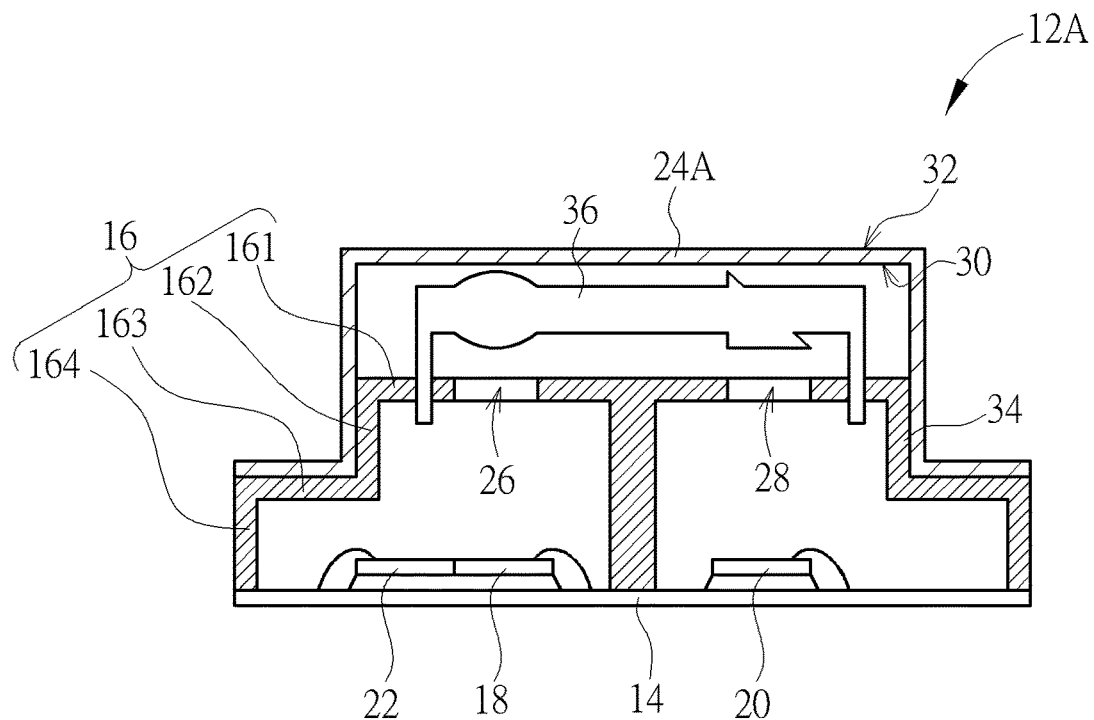
FIG. 7 is a sectional view of the optical detection device according to a third embodiment of the present invention.

Please refer to FIG. 7. FIG. 7 is a sectional view of the optical detection device 12A according to a third embodiment of the present invention. In the third embodiment, elements having the same numerals as ones of the foresaid embodiment have the same structures and functions, and the detailed description is omitted herein for simplicity. The optical detection device 12A can include the substrate 14, the housing 16, the optical sensor 18, the optical emitter 20, the operation processor 22, the cover 24A and an optical modulating component 36. The shape of the housing 16 is common design, and is unvaried due to the inspection standard or the design requirement of the optical detection device 12A. The optical modulating component 36 can be disposed on the housing 16, and have two sections having optical modulating function respectively aligning with the first aperture 26 and the second aperture 28. The optical modulating component 36 can gather light, and used to increase illumination ability of the optical emitter 20 and enhance signal gathering intensity of the optical sensor 18.

The first surface 30 of the cover 24A can be spaced from the housing 16, and the optical modulating component 36 can be accommodated inside a space between the cover 24A and the housing 16. The contour of the first surface 30 can be matched with the shape of the housing 16, such as the square type. The second surface 32 of the cover 24A can be manufactured in accordance with the predefined appearance demand of the optical navigation apparatus 10, such as the elliptic type shown in FIG. 6, and can preferably align with an outer surface of the optical navigation apparatus 10, so the optical navigation apparatus 10 can have artistic appearance and the cover 24A can be tightly engaged with the hole 101. Therefore, the optical detection device 12A uncovered by the cover 24A can be rapidly manufactured in batch production and then applied for the product qualification procedure. The first case 10a and the related hole 101 can be manufactured in accordance with the predefined appearance demand. The first surface 30 and the second surface 32 of the cover 24A can be manufactured in accordance with the shapes of the housing 16 and the hole 101, so that the cover 24A can be engaged with the housing 16 in the replaceable manner without the additional product qualification procedure for assembly of the optical detection device 12A.

In the third embodiment, the cover 24A can be disposed on the upper surface of the housing 16 to expose the lateral surface of the housing 16; for example, the cover 24A may be attached to the high-level lateral portion 162 and the flat portion 163, and does not contact the low-level lateral portion 164. The cover 24A can be made by the transparent material or the translucent material. The cover 24A can shelter and seal the first aperture 26 and the second aperture 28 when being disposed on the housing 16. The cover 24A can allow optical signal transmission for receiving of the optical sensor 18 and emitting of the optical emitter 20, and further prevent the optical detection device 12A from damage due to dust or moisture entering the housing 16.

Figure 8:
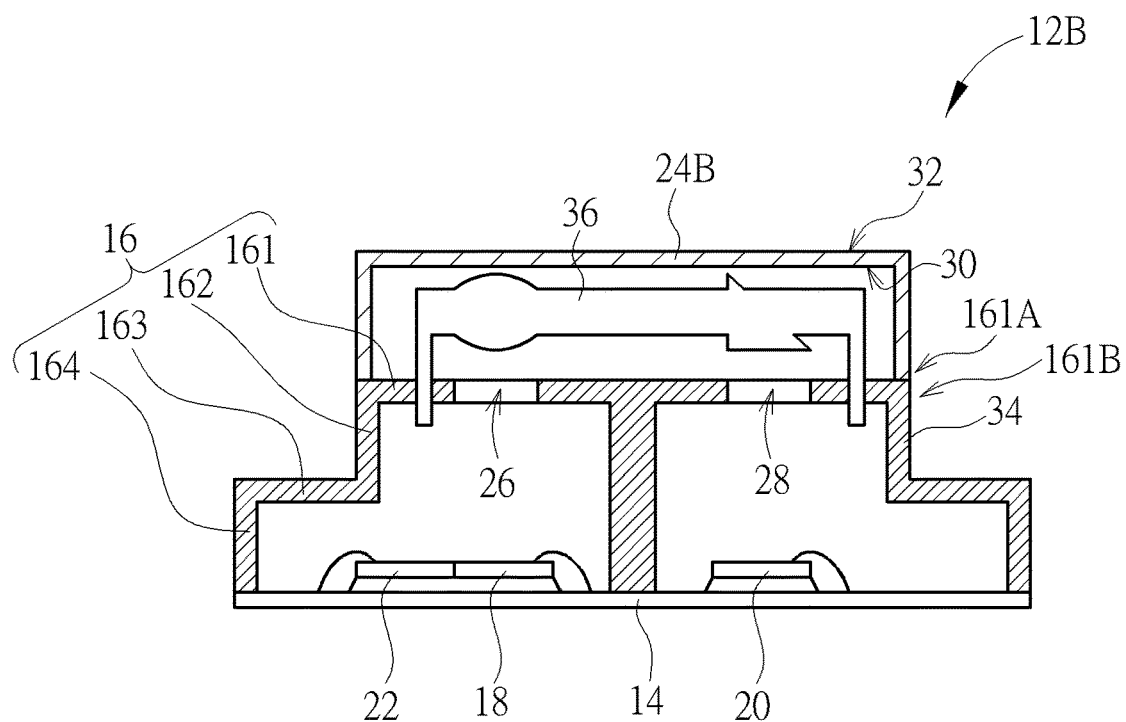
FIG. 8 is sectional view of the optical detection device according to a fourth embodiment of the present invention.

Please refer to FIG. 8. FIG. 8 is sectional view of the optical detection device 12B according to a fourth embodiment of the present invention. In the fourth embodiment, elements having the same numerals as ones of the foresaid embodiment have the same structures and functions, and the detailed description is omitted herein for simplicity. The cover 24B of the optical detection device 12B can be spaced from the housing 16, and the optical modulating component 36 can be disposed inside the space between the housing 16 and the first surface 30 of the cover 24B. The contour of the first surface 30 can be matched with the shape of the housing 16. The second surface 32 of the cover 24A can be manufactured in accordance with the predefined appearance demand of the optical navigation apparatus 10, and preferably align with the outer surface of the optical navigation apparatus 10.

The cover 24B can be assembled with the upper portion 161 of the housing 16 in the replaceable manner, and does not cover the high-level lateral portion 162, the flat portion 163 and the low-level lateral portion 164, for exposing the engaging portion 34 which is formed by the high-level lateral portion 162 and the flat portion 163; therefore, the lateral surface of the cover 24B can align with the lateral side 161A of the upper portion 161, and the cover 24B does not contact the lateral surface 161B of the upper portion 161. The cover 24B can be designed as a specific structure having a sunken space. The inner surface of the cover 24B can be interpreted as the first surface 30, and the contour of the first surface 30 is unvaried in accordance with the inspection standard or the design requirement of the optical detection device 12B. The optical modulating component 36 can be disposed inside the sunken space surrounded by the lateral walls and the inner surface of the cover 24B, and further be disposed on the housing 16. An outer surface of the cover 24B can be interpreted as the second surface 32, and the contour of the second surface 32 can be tightly engaged with the hole 101.

Figure 9:
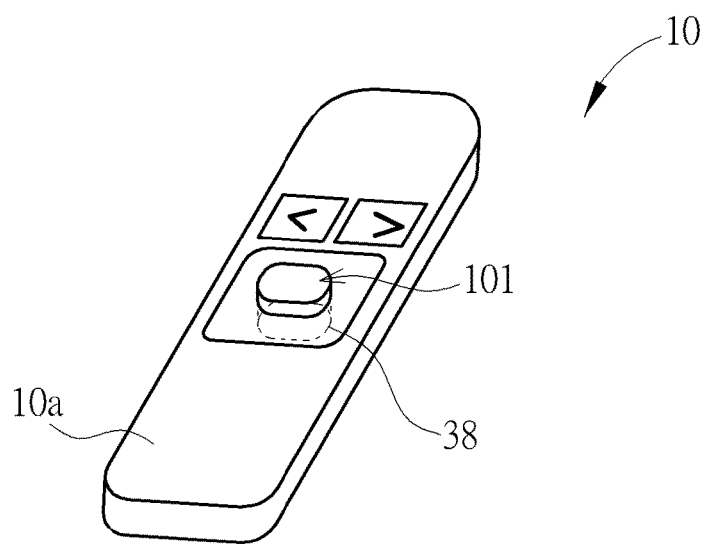
FIG. 9 is a diagram of a part of the optical navigation apparatus according to another embodiment of the present invention.
Figure 10:
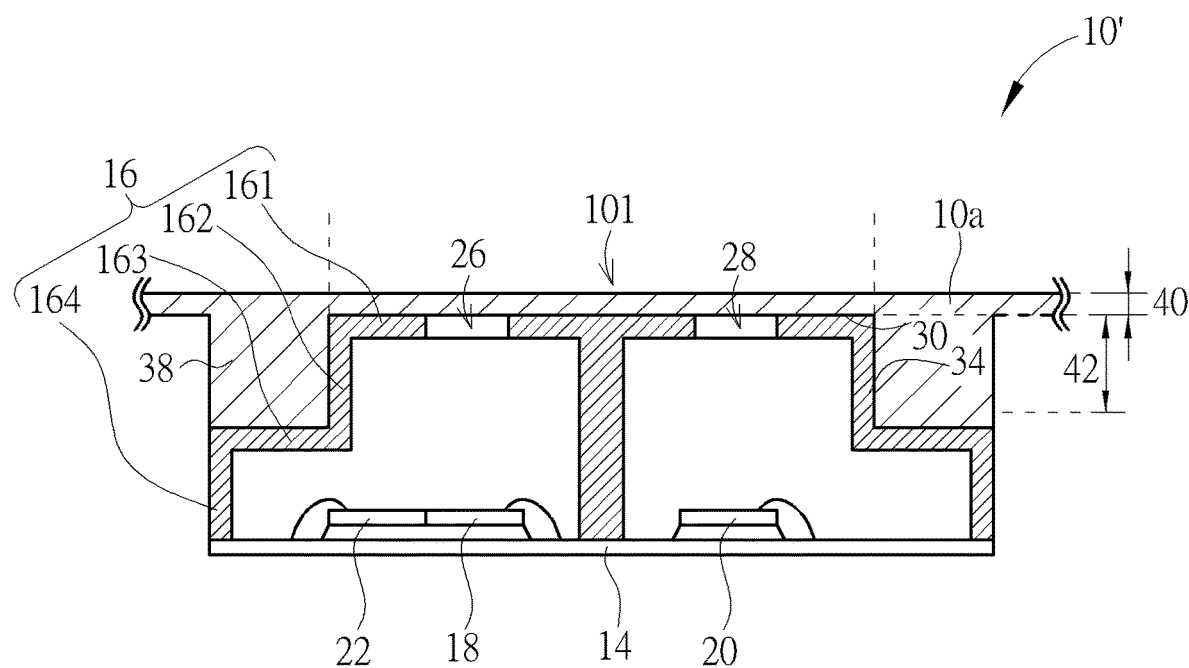
FIG. 10 and FIG. 11 are sectional views of the part of the optical navigation apparatus applied for the optical detection device according to another embodiment of the present invention.
Figure 11:
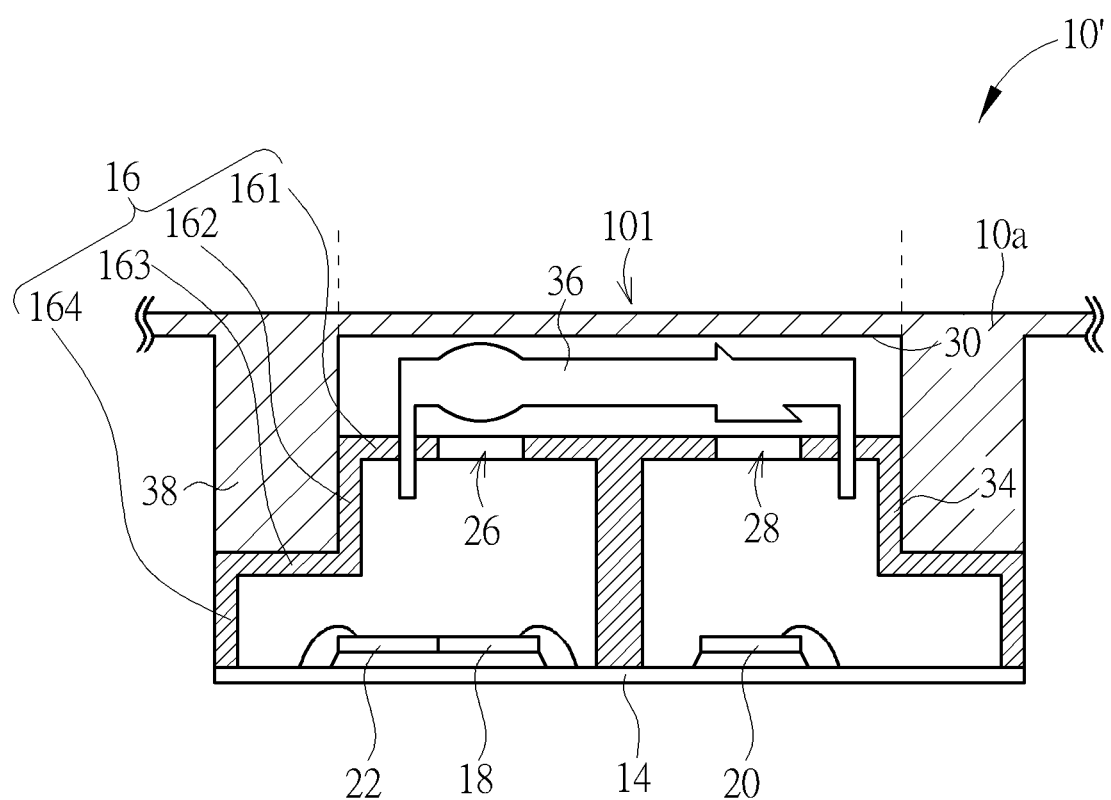

Please refer to FIG. 9 to FIG. 11. FIG. 9 is a diagram of a part of the optical navigation apparatus 10' according to another embodiment of the present invention. FIG. 10 and FIG. 11 are sectional views of the part of the optical navigation apparatus 10' applied for the optical detection device 12 according to another embodiment of the present invention. In this embodiment, elements having the same numerals as ones of the foresaid embodiments have the same structures and functions, and the detailed description is omitted herein for simplicity. The first case 10a of the optical navigation apparatus 10' can include an accommodating structure 38, and the accommodating structure 38 can be disposed on an inner of the first case 10a. The shape and the contour of the accommodating structure 38 can be varied due to the inspection standard or the design requirement of the optical detection device 12. For example, if the hole 101 is the elliptic type and the housing 16 is the square type, an upper section 40 of the accommodating structure 38 can be designed as the elliptic type related to the hole 101, and a lower section 42 of the accommodating structure 38 can be designed as the square type related to the housing 16. The housing 16 can be engaged with the accommodating structure 38 in the replaceable manner for aligning with the hole 101 on the first case 10a.

The accommodating structure 38 can have a boundary set between the upper section 40 and the lower section 42, and position of the boundary can depend on a thickness of the first case 10a and a height of the housing 16; an actual application of the boundary is not limited to the embodiment shown in FIG. 10 and FIG. 11. The first case 10a and the accommodating structure 38 may be monolithically integrated with each other; further, the accommodating structure 38 may be made and then disposed on the first case 10a to align with the hole 101. The inner surface of the accommodating structure 38 can be close to the upper portion 161 of the housing 16, such as the embodiment shown in FIG. 10. The inner surface of the accommodating structure 38 may be spaced from the upper portion 161 of the housing 16, and the optical modulating component 36 can be disposed between the accommodating structure 38 and the housing 16, such as the embodiment shown in FIG. 11.

Moreover, when the housing 16 is engaged with the accommodating structure 38, the lateral surface (which means the low-level lateral portion) of the housing 16 can be exposed, and inner of the optical navigation apparatus 10' can have some surplus space sufficient for arrangement of other applicable electronic components. The accommodating structure 38 can be assembled with the upper surface of the housing 16, such as covering the high-level lateral portion 162 and the flat portion 163, or covering the upper portion 161 and the high-level lateral portion 162 and the flat portion 163. The first aperture 26 and the second aperture 28 can be sheltered and sealed by the accommodating structure 38, so as to prevent the optical detection device 12 from damage due to the dust or the moisture entering the housing 16.

In the present invention, the cover or the accommodating structure directly abutting against the housing can minimize a vertical dimension of the optical detection device, and the cover or the accommodating structure disposed on the upper surface of the housing can reduce a horizontal dimension of the optical detection device. The package assembly including the substrate, the housing, the optical sensor, the optical emitter and the operation processor (but excluding the cover or the accommodating structure) can be assembled and examined by the product qualification procedure, and the cover and the accommodating structure can be an independent element not examined by the product qualification procedure. The package assembly can be assembled with the cover or the accommodating structure having any exterior contour manufactured for the appearance demand of the optical navigation apparatus. That is to say, the cover (or the accommodating structure) provided by the optical navigation apparatus and the package assembly as two separated components. The contour of one surface of the cover or the accommodating structure is designed according to the hole on the optical navigation apparatus. The exterior of the package assembly is unchanged no matter what the cover (or the accommodating structure) seems like. As if the product qualification procedure of the package assembly is implemented, the cover and the accommodating structure with the particularly redesigned contour can be attached to the package assembly and does not need extra product qualification procedure for the second time; thus, the present invention can economize qualification cost and qualification time of the optical detection device and the optical navigation apparatus effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical detection device applied to an optical navigation apparatus and suitable for a variety of appearance, the optical detection device comprising:
   a substrate;
   a housing disposed on the substrate and comprising a first aperture, the housing being unvaried due to inspection standard or design requirement of the optical detection device;
   an optical modulating component disposed on the housing and aligning with the first aperture;
   an optical sensor disposed on the substrate and adapted to receive an optical signal passing through the optical modulating component and the first aperture; and
   a cover disposed on the housing in a spaced manner to cover the optical modulating component that is located above the first aperture, the cover being replaceable for attaching the cover varied for the inspection standard or the design requirement to the unvaried housing in response to a surface of the cover opposite to the housing matched and engaged with a light penetrating area on the optical navigation apparatus.

2. The optical detection device of claim 1, wherein the cover is disposed on an upper side of the housing to expose a lateral of the housing and to seal and cover the first aperture.

3. The optical detection device of claim 1, wherein the cover comprises a first surface and a second surface opposite to each other, a contour of the first surface is matched with a shape of the housing, a contour of the second surface is matched with the light penetrating area on the optical navigation apparatus, and the second surface aligns with an outer surface of the optical navigation apparatus.

4. The optical detection device of claim 1, wherein the housing comprises an engaging portion adapted to engage with the optical navigation apparatus, the engaging portion is adjacent to an upper portion of the housing, a first surface of the cover is attached to the upper portion and the engaging portion, and an edge of the cover aligns with a lateral side of the engaging portion.

5. The optical detection device of claim 1, wherein the cover is not attached to a lateral portion of the housing.

6. The optical detection device of claim 1, wherein the optical detection device is in no need of extra product qualification procedure in response to assembly of the cover and the housing.

7. The optical detection device of claim 1, wherein the housing further comprises a second aperture, and the optical detection device further comprises an optical emitter disposed on the substrate and adapted to emit the optical signal toward the second aperture.

8. The optical detection device of claim 1, wherein the optical detection device further comprises an operation processor electrically connected to the optical sensor and adapted to analyze a sensor datum from the optical sensor.

9. An optical detection device applied to an optical navigation apparatus and suitable for a variety of appearance, the optical detection device comprising:
 a substrate;
 a housing disposed on the substrate and comprising a first aperture and an engaging portion, the engaging portion being adapted to engage with the optical navigation apparatus, the housing being unvaried due to inspection standard or design requirement of the optical detection device;
 an optical modulating component disposed on the housing and aligning with the first aperture;
 an optical sensor disposed on the substrate and adapted to receive an optical signal passing through the optical modulating component and the first aperture; and
 a cover attached to the housing in a spaced manner except the engaging portion for covering the optical modulating component that is located above the first aperture, the cover being replaceable for attaching the cover varied for the inspection standard or the design requirement to the unvaried housing in response to a surface of the cover opposite to the housing matched and engaged with a light penetrating area on the optical navigation apparatus.

10. The optical detection device of claim 9, wherein the cover is disposed on an upper side of the housing to expose a lateral of the housing and to seal and cover the first aperture.

11. The optical detection device of claim 9, wherein the cover comprises a first surface and a second surface opposite to each other, a contour of the first surface is matched with a shape of the housing, a contour of the second surface is matched with the light penetrating area on the optical navigation apparatus, and the second surface aligns with an outer surface of the optical navigation apparatus.

12. The optical detection device of claim 9, wherein the engaging portion is adjacent to an upper portion of the housing, the cover is attached to the upper portion, an edge of the cover aligns with a lateral side of the upper portion, and the cover is not attached to a lateral surface of the upper portion of the housing.

13. The optical detection device of claim 9, wherein the housing further comprises a second aperture, and the optical detection device further comprises an optical emitter disposed on the substrate and adapted to emit the optical signal toward the second aperture.

14. The optical detection device of claim 9, wherein the optical detection device further comprises an operation processor electrically connected to the optical sensor and adapted to analyze a sensor datum from the optical sensor.

15. An optical navigation apparatus, comprising:
 a case having an accommodating structure, the accommodating structure comprising an upper section and a lower section connected to each other;
 a circuit board disposed inside the case; and
 an optical detection device, comprising:
  a substrate disposed on the circuit board;
  an optical sensor disposed on the substrate and adapted to receive an optical signal entering the case; and
  a housing disposed on the substrate and covering the optical sensor, the housing comprising a first aperture where through the optical signal passes, the housing being covered by the accommodating structure wherein the upper section is varied for inspection standard or design requirement of the optical detection device and the lower section is connected to the housing unvaried due to the inspection standard or the design requirement, and the housing is attached to the accommodating structure in a replaceable manner for aligning with a light penetrating area on the optical navigation apparatus.

16. The optical navigation apparatus of claim 15, wherein the optical detection device further comprises an optical modulating component disposed on the housing and aligning with the first aperture, the optical signal passes through the optical modulating component and is received by the optical sensor.

17. The optical navigation apparatus of claim 15, wherein the housing is attached to the accommodating structure to expose a lateral of the housing.

18. The optical navigation apparatus of claim 15, wherein the accommodating structure is disposed on an upper side of the housing to seal and cover the first aperture.

19. The optical navigation apparatus of claim 15, wherein the housing further comprises a second aperture, and the optical detection device further comprises an optical emitter disposed on the substrate and adapted to emit the optical signal toward the second aperture.

20. The optical navigation apparatus of claim 15, wherein the optical detection device further comprises an operation processor electrically connected to the optical sensor and adapted to analyze a sensor datum from the optical sensor.

* * * * *